United States Patent
Tsai et al.

(10) Patent No.: US 9,793,350 B1
(45) Date of Patent: Oct. 17, 2017

(54) MULTIPLE LAYER SIDE-GATE FET SWITCH

(71) Applicant: Northrop Grumman Systems Corporation, Falls Church, VA (US)

(72) Inventors: Roger S. Tsai, Torrance, CA (US); Sumiko L. Poust, Hawthorne, CA (US); Weidong Liu, San Marino, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/464,512

(22) Filed: Mar. 21, 2017

(51) Int. Cl.
| | |
|---|---|
| *H01L 29/786* | (2006.01) |
| *H01L 29/06* | (2006.01) |
| *H01L 29/08* | (2006.01) |
| *H01L 29/417* | (2006.01) |
| *H01L 29/423* | (2006.01) |
| *H01L 29/78* | (2006.01) |
| *H01L 27/088* | (2006.01) |
| *H01L 21/8234* | (2006.01) |

(52) U.S. Cl.
CPC .. *H01L 29/0692* (2013.01); *H01L 21/823412* (2013.01); *H01L 27/0886* (2013.01); *H01L 29/0649* (2013.01); *H01L 29/0847* (2013.01); *H01L 29/41758* (2013.01); *H01L 29/42356* (2013.01); *H01L 29/42372* (2013.01); *H01L 29/785* (2013.01); *H01L 29/78696* (2013.01)

(58) Field of Classification Search
CPC ....... H01L 21/70; H01L 21/702; H01L 21/71; H01L 21/8232
See application file for complete search history.

(56) References Cited

U.S. PATENT DOCUMENTS

| | | | |
|---|---|---|---|
| 5,619,061 | A | 4/1997 | Goldsmith et al. |
| 9,202,906 | B2 | 12/2015 | Howell et al. |
| 2013/0175530 | A1* | 7/2013 | Noda ............... H01L 29/78693 257/57 |

OTHER PUBLICATIONS

Pan, K.C. et al; Vanadium Oxide Thin-Film Variable Resistor-Based RF Switches; IEEE Transactions on Electron Devices, vol. 62, No. 9; Sep. 2015; pp. 2959-2965; 0018-9383; IEEE; 2015.

(Continued)

*Primary Examiner* — Cheung Lee
(74) *Attorney, Agent, or Firm* — Patti & Malvone Law Group, LLC

(57) ABSTRACT

An exemplary FET includes a base and first and second stacked layer groups each having a nonconductive layer and a semiconductive layer adjacent the nonconductive layer. Source and drain electrodes are in low resistance contact with the semiconductive layers. First and second parallel trenches extend vertically between the source and drain electrodes to create access to first and second edges, respectively, of the layers. A 3-dimensional ridge is defined by the layers between the first and second trenches. A continuous conductive side gate extends generally perpendicular to the trenches and engages the first edges, the top of the ridge and the second edges. A gate electrode is disposed in low resistance contact with the conductive side gate. The figure of merit for the FET increases as the number of layer groups increases. A plurality of parallel spaced apart ridges, all engaged by the same side gate, can be utilized.

20 Claims, 5 Drawing Sheets

(56) References Cited

OTHER PUBLICATIONS

Wang, M. et al; Need a Change? Try GeTe; IEEE Microwave Magazine; Dec. 2016; 1524-3342/16; pp. 70-79; Digital Object Identifier 10.1109/MMM.2016.2608699.
Nakamoto, M. et al; Uniform, Stable and High Integrated Field Emitter Arrays for High Performance Displays and Vacuum Microelectronic Switching Devices; 0-7803-4100-7/97; 1997 IEEE; IEDM 97-717-720; 29.3.1-29.3.4.
Jacobs, E.W. et al; Photo-Injection PIN Diode Switch for High Power RF Switching; 0-7803-6520-8/01; 2001; IEEE; pp. 1274-1279.
Cai, M. et al; Micro-Plasma Field-Effect Transistors; 978-1-4577-1767/3/12; 2012; IEEE; 4 Pages.
Cross, L.E. et al; Theory and Demonstration of Narrowband Bent Hairpin Filters Integrated with AC-Coupled Plasma Limiter Elements; IEEE Transactions on Electromagnetic Compatibility, vol. 55, No. 6, Dec. 2013; 3018-9375; 2013; pp. 1100-1106.

* cited by examiner

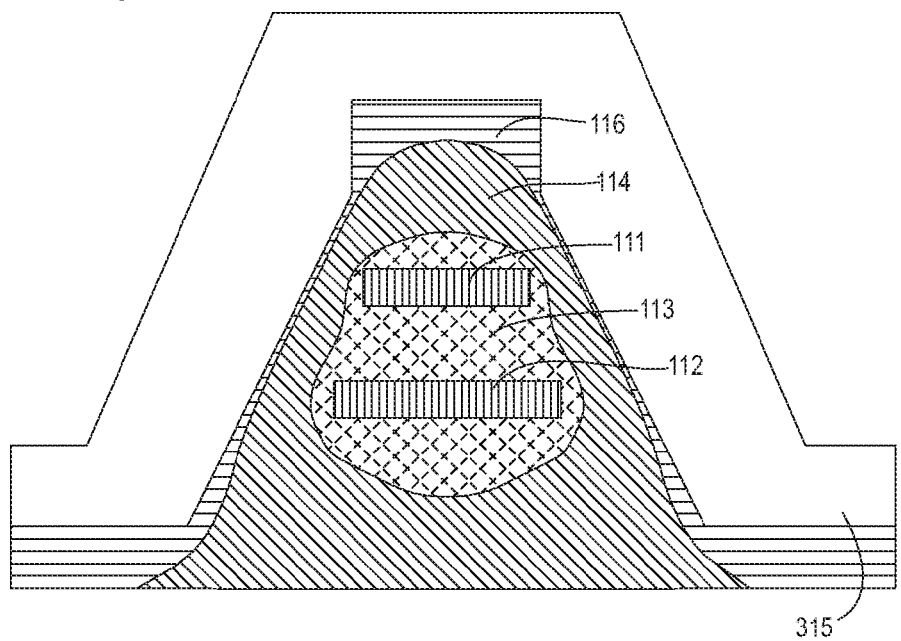
Fig. 5   ON STATE POTENIAL
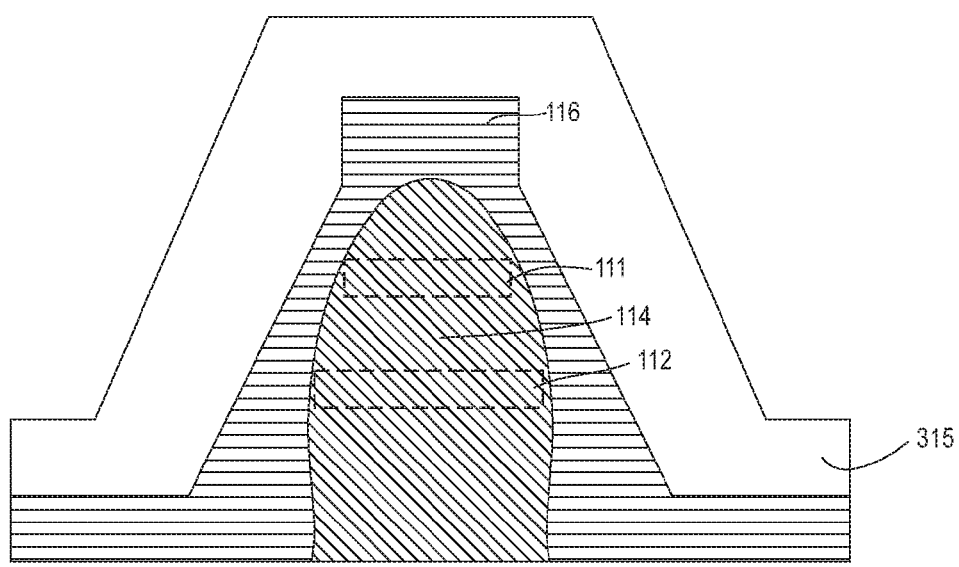
Fig. 6   OFF STATE POTENIAL

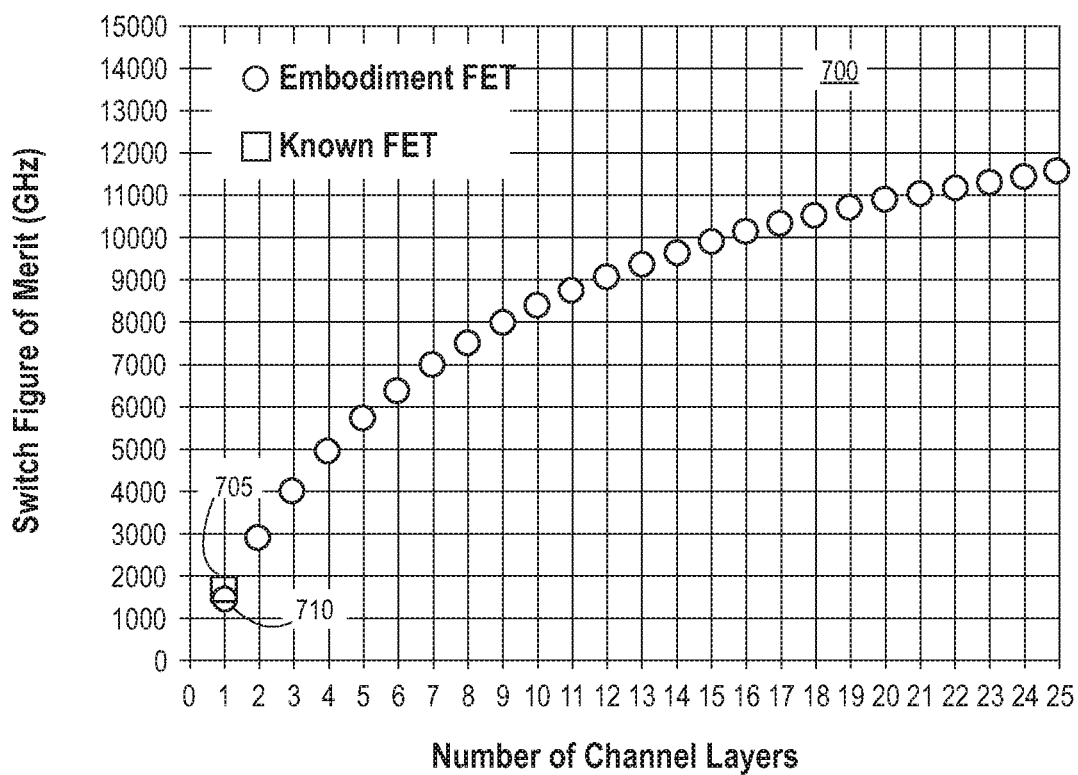

MULTIPLE LAYER SIDE-GATE FET SWITCH

BACKGROUND

This invention relates to field effect transistor (FET) switches for switching a radio frequency (RF) signal path between ON and OFF states and is especially, but not exclusively, suited for use as an RF switch with a high figure of merit, which produces low RF loss and high isolation at high frequencies, or across a wide bandwidth of frequencies.

The increase of electronic applications operating at high frequencies has placed a corresponding demand on the ability of transistor switches to serve as an effective signal path switch with low insertion loss in the ON state and very high impedance in the OFF state. Depending on the design of the specific electronic circuitry or an antenna feed system with a multiple signal feed structure, there is often a need to provide a switch in one or more signal paths in order to control signal flow. With circuitry operating at ultra high frequencies, e.g. 0.3 GHz and above, there exists a need for switching transistors that can provide improved performance.

SUMMARY

It is an object of the present invention to provide an improved switching transistor that satisfies this need.

An exemplary FET includes a base and first and second stacked layer groups each having a nonconductive layer and a semiconductive layer adjacent the nonconductive layer. Source and drain electrodes are in low resistance contact with the semiconductive layers. First and second parallel trenches extend vertically between the source and drain electrodes to create access to first and second edges, respectively, of the layers. A 3-dimensional ridge is defined by the layers between the first and second trenches. A continuous conductive side gate extends generally perpendicular to the trenches and engages the first edges, the top of the ridge and the second edges. A gate electrode is disposed in low resistance contact with the conductive side gate. The figure of merit for the FET increases as the number of layer groups increases. A plurality of parallel spaced apart ridges, all engaged by the same side gate, can be utilized.

DESCRIPTION OF THE DRAWINGS

Features of exemplary implementations of the invention will become apparent from the description, the claims, and the accompanying drawings in which:

FIGS. 5 and 6 illustrate representative electric potential across a ridge in the ON and OFF states, respectively.

FIG. 7 is a graph showing figures of merit versus the number of channel layers.

DETAILED DESCRIPTION

Figure 1:
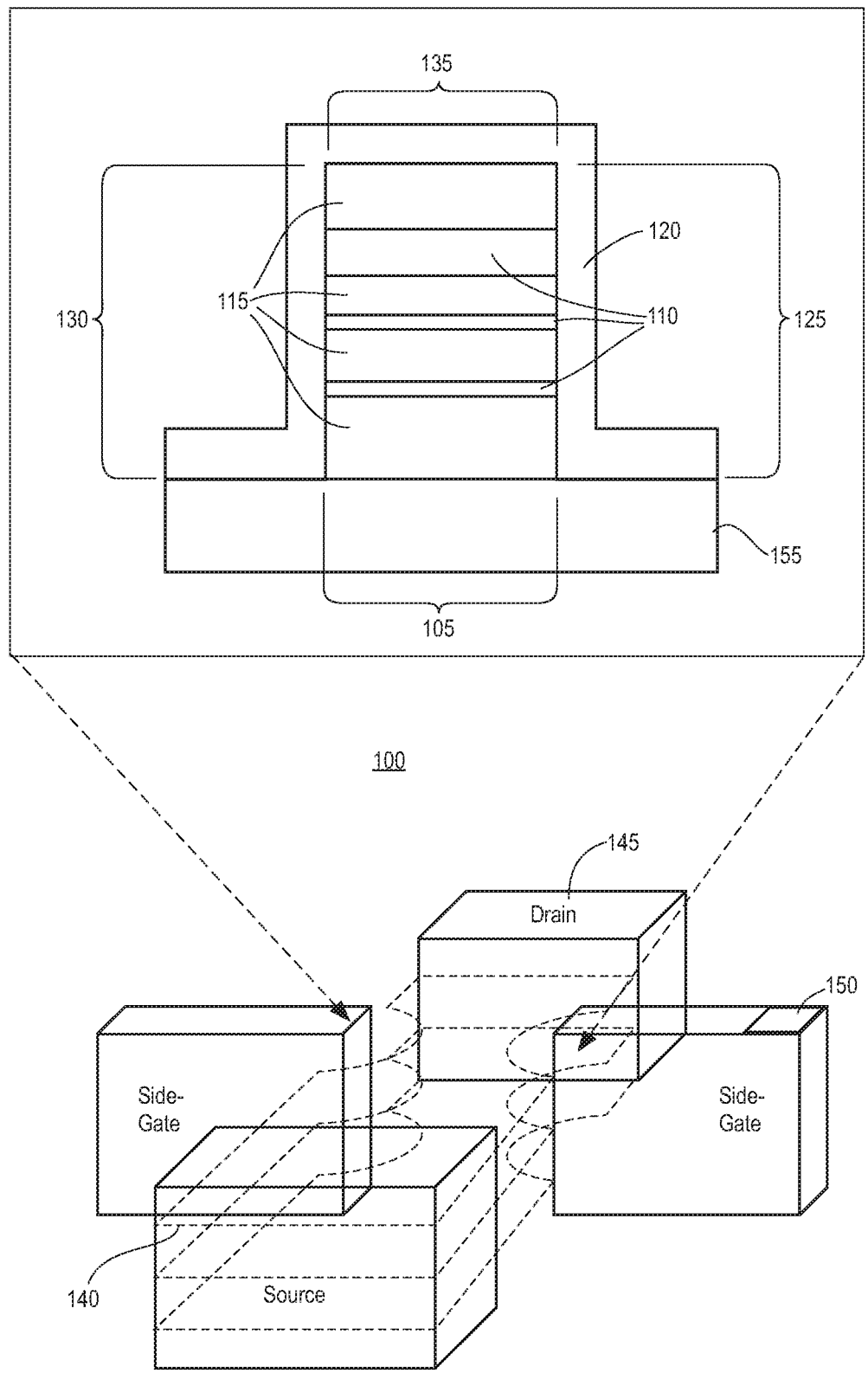
FIG. 1 is a representative diagram of an FET switching transistor in accordance with an embodiment of the present invention. It includes an exploded cross-sectional representation of a "ridge" with multiple semiconducting channel layers, separated by non-conducting barrier layers, and a conductive side-gate.

FIG. 1 shows a representative FET switching transistor 100 in accordance with an embodiment of the present invention. An idealized cross-sectional representation of a ridge 105 shows multiple, vertically stacked, planar layers of semiconducting layers 110 each separated by corresponding nonconductive layers 115. A conductive side-gate 120 engages the sides 125 and 130 and top 135 of the 3-dimensional ridge 105. Each of the semiconductive layers 110 are in low resistance contact, i.e. low resistance contact, at the respective ends of the planar layers to a source electrode or contact 140 and a spaced apart drain electrode or contact 145 of the FET 100. A gate electrode or contact 150 can be disposed at any convenient location in a low resistance connection with the side-gate 120. The layers 110 and 115 are disposed on a nonconductive substrate or base 155. The semiconductive layers 110, i.e. channel layers, are separated by the nonconductive layers 115 that minimize carrier wave function coupling between adjacent channel layers to ensure that the device does not operate as a superlattice structure. A superlattice structure has a periodic structure of two or more semiconductor layers where the layers are thin enough to allow carrier transport by tunneling to occur, i.e. carriers in one semiconductor layer tunnel or traverse an adjacent nonconductive layer to reach a next semiconductor layer. In accordance with FET embodiments of the present invention, the carriers in one semiconductor layer in a ridge do not migrate through an adjacent nonconductive layer to reach another semiconductor layer in the ridge in either OFF or ON state. The nonconductive layers 115 are made of a material and are of a thickness to inhibit carrier tunneling between adjacent semiconducting layers.

Figure 1A:
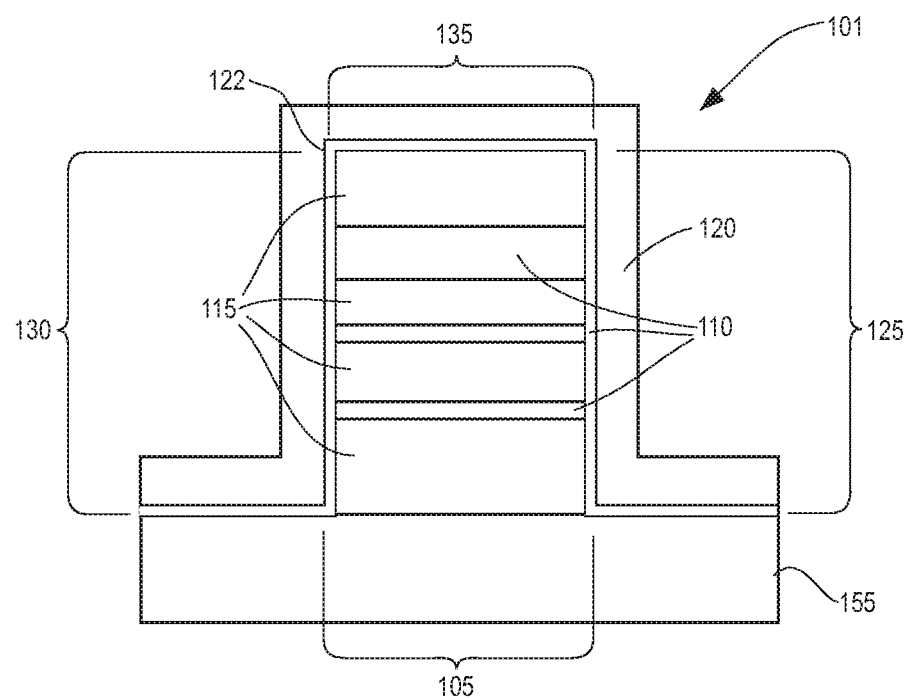
FIG. 1A shows the same exploded embodiment as FIG. 1 but with an insulating layer between the side-gate and the ridge.

FIG. 1A shows an exploded embodiment 101 similar to the corresponding structure shown in FIG. 1 but with an insulating (non-conductive) layer 122 disposed between the side-gate 120 and the ridge 105. Depending on the design objectives and desired characteristics, using an insulated side-gate may be desirable.

Figure 2:
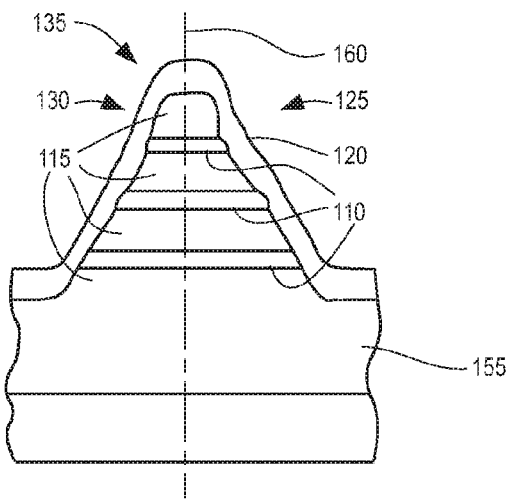
FIG. 2 is a representative cross-sectional view of one ridge of an exemplary FET switching transistor in accordance with an embodiment of the present invention.

FIG. 2 shows a cross-sectional view of one ridge 105 of FET 100 in a practical implementation in which semiconductor manufacturing methods, e.g. epitaxial fabrication, deposition, etching, etc., have been used to fabricate the ridge. In this embodiment will be noticed that the sides 125, 130 of the ridge 105 are generally vertical but have a slope with regard to the center line 160 with the portions of the ridge closest to the substrate 155 being further from the center line 160 (wider) than the portions of the ridge near its top 135. This slope is due to a normal etching away fabrication process since the upper layers will have been exposed for etching for a longer time than the lower layers near the substrate 155, assuming the etching starts from the top. It is anticipated that the side-gate 120 will be deposited following the etching process to extend across the ridge and adjacent trenches/valleys.

The ridge 105 may be formed by etching away spaced apart portions of the parallel layers 110 and 115 resulting in one or more generally parallel ridges or "saddles" in which the layers 110 and 115 remain between the etched away areas (trenches); see FIG. 1. Although FIG. 1 shows only left and right portions of the side gate 120, it will be understood that this is only to facilitate a better view of the ridge structure and that the actual structure of the side gate 120 extends continuously over and engaging the entirety of the ridge including its top as shown in FIG. 2.

The operation of the FET switching transistor 100 is based on capacitive and lateral coupling to carriers in each channel layer by fields from the side gate. The side gate modulates carrier concentration at lateral edges in each channel layer as a function of the gate to source voltage. In the switch ON state, carrier concentration in each channel layer is high, is approximately constant/uniform across the channel, and extends over the width of each channel layer enabling a high electrical conductance between the source and drain contacts. In the switch OFF state, carriers are depleted throughout each semiconductor channel layer due to fields from the side gate which leads to negligible electrical conductance between the source and drain contacts. Each channel may be doped with carriers by any conventional means, e.g. modulation, bulk doping, piezoelectric, electrostatic, etc., and may be doped to different effective concentrations, but all channels should be doped with the same carrier type, i.e. electron or hole.

Figure 3:
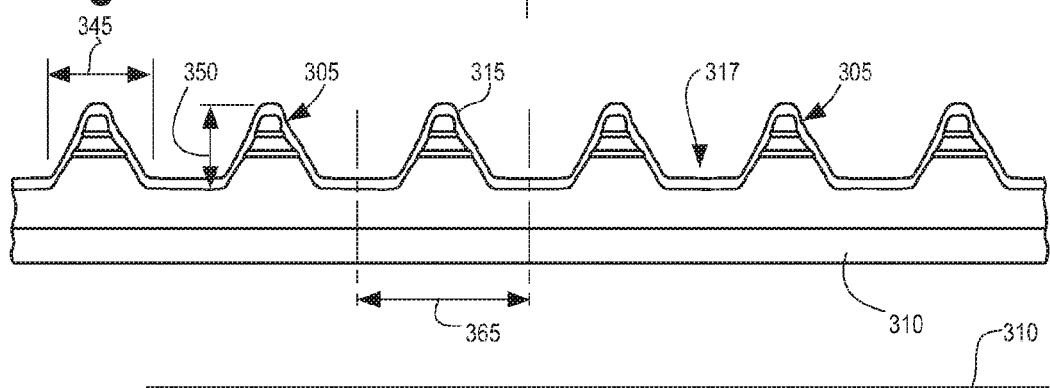
FIG. 3 shows a representative cross-sectional view of an exemplary FET switching transistor in accordance with an embodiment of the present invention having a plurality of parallel ridges.

FIG. 3 shows a representative cross-sectional view of an exemplary FET switching transistor 300 which has a plurality of parallel ridges 305 on a substrate 310. Each ridge 305 has a plurality of layers as explained above. A single continuous conductive side gate 315 abuts and traverses across the sides and top of the ridges and adjacent trenches/valleys 317. The ridge has a width 345 and a height 350. The ridge pitch, i.e. dimension of the repetitive spacing of the ridges, is represented by 365.

Figure 4:
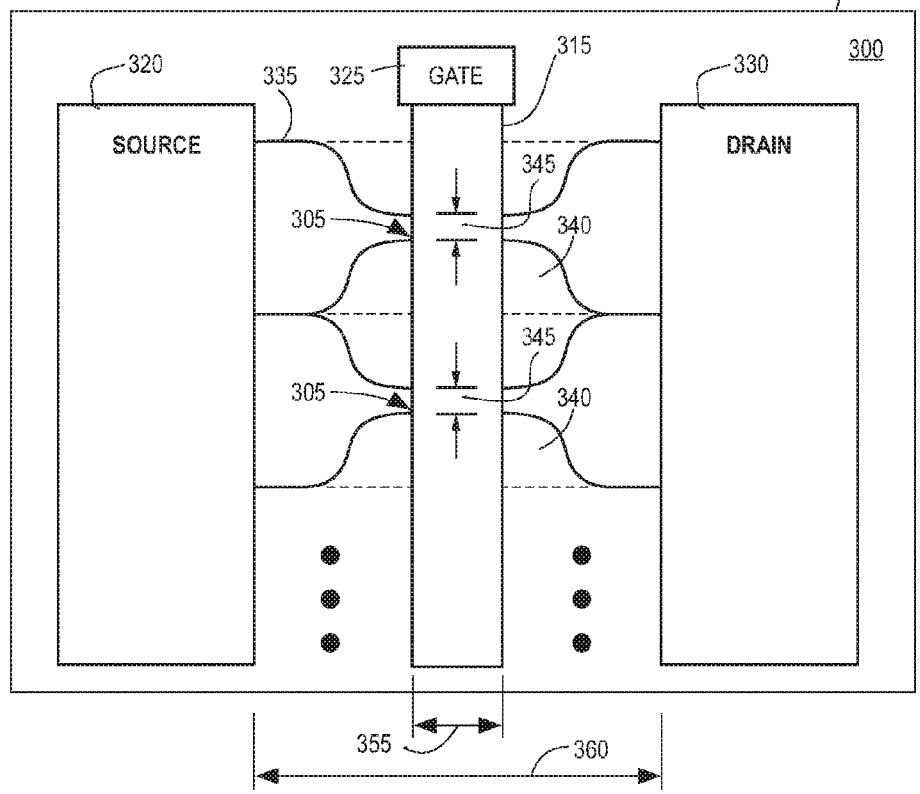
FIG. 4 is an illustrative top view of an exemplary FET switching transistor having multiple parallel ridges in accordance with an embodiment of the present invention.

FIG. 4 shows an illustrative top view of an exemplary FET switching transistor 300 having multiple parallel ridges 305. Source contact 320, gate contact 325 and drain contact 330 provide conductive pads for connecting the transistor 300 to other circuitry. A nonconductive layer 335, and corresponding interleaved semiconductive and nonconductive layers below, extended with uniform width from the source 320 to the drain 330 prior to etching which forms the ridges 305. The regions 340 adjacent the conductive side gate 315 as shown in FIG. 4 represent areas (trenches) in which the interleaved layers have been etched away. The width 345 of the ridge and the ridge height 350 define an aspect ratio of the ridges. The width of the side gate is represented by 355 and the source to drain spacing is represented by 360.

FIGS. 5 and 6 illustrate representative electric potential across a cross section of a ridge in the ON and OFF states, respectively. The side gate 315 defines the external structure of the ridge. As seen in the ON state FIG. 5, the lowest potential exists over all of the semiconducting layer regions containing carriers 111 and 112. Lesser potential 113 exists between and closely around these layers. Significant potential exists in region 114 and the highest potential exists in region 116. This reflects that the carrier concentration is constant and extends substantially across the width of the ridge in the semiconducting layers 111 and 112 to provide high conductance between source and drain. As seen in OFF state FIG. 6, it will be noted that potential level 113 is not present. The lowest shown potential 114 exists only near the centers of the semiconducting layers 111 and 112. Significant potential exists in region 116 which is a wider band than in FIG. 5. This reflects that the carriers are depleted throughout the semiconducting layers 111 and 112 to provide substantially no conductance between source and drain. It will be understood that the referenced potentials in FIGS. 5 and 6 do not indicate carrier transport between layers, due to tunneling, since the exemplary FET does not operate as a superlattice.

FIG. 7 is a graph 700 showing figures of merit versus the number of channel layers. A figure of merit of conventional FET switches, e.g. HEMT, MOSFET, JFET, FINFET, is measured in Hertz by:

$$F=1/(2\pi*R_{ON}C_{OFF})$$

where F is the figure of merit; $R_{ON}$ is resistance in the ON state; $C_{OFF}$ is capacitance in the OFF state. $C_{OFF}$ is composed of channel to gate parasitic fringing capacitance plus the OFF state channel fringing capacitance.

Figure of merit (F) in Hertz for FET embodiments in accordance with the present invention is given by:

$$F=NL/((K*R_{SHi}+2*R_{CONTi})*[C_{TR1}+C_{TRNL}+(NL-2)*(C_{Vi}+C_{Ri})])$$

where NL is the number of layers >=2; K is a unitless factor dependent on FET channel geometry; $R_{SHi}$ in ohms/square is the channel layer sheet resistance; $R_{CONTi}$ is the source/drain contact resistance to each channel layer; $C_{TR1}$ in farads is the trench and ridge fringing capacitance for the first (top) channel layer; $C_{TRNL}$ in farads is the trench and ridge fringing capacitance for the last (bottom) channel layer; $C_{Vi}$ in farads is the valley/trench layer-to-layer fringing capacitance for 1<i<NL; $C_{Ri}$ in farads is the ridge layer-to-layer fringing capacitance for 1<i<NL.

Comparing an FET embodying the present invention with a conventional FET, where both have the same widths, $(K*Rshi+2*Rconti)*(C_{Vi}+C_{Ri})$ for NL=many layers approximates the total on-state resistance multiplied by off-state capacitance for the FET embodying the present invention and is much less than (K*Rshi+2*Rconti)*(CTR1+CTRNL) for the conventional FET switch. Smaller products of ON state resistance multiplied by OFF state capacitance results in higher figures of merit. As seen from the chart 700, F (as shown in GHz) of 1700 for the conventional FET switch is shown as point 705 is substantially equal to point 710 representing an embodiment FET with NL=1. However, as points representing increasing values of NL shows, the corresponding F for embodiments of the present invention also increases. For example, for NL=2, 5, 10, 20 the corresponding values of F are 3000, 5800, 8300, 10,900. For a mathematical limit NL→∞, F=15,600 GHz. As will be appreciated from graph 700, even for NL=2 or 4, the embodiment FET achieves an F of about twice and 4 times, respectively, that of a conventional FET. Thus, for even a moderate number of interleaved layers, the embodiment FET provides substantially improved performance.

One exemplary method of making an FET in accordance with the present invention is to grow sequential adjacent layers on a substrate in a known epitaxial technique. The trench/valley regions can then be etched away and the side gate then deposited over the exposed ridge structure. Metallic contact pads for the source, drain and side gate can be deposited to enable connections to be made with the FET. Of course, other techniques could be used as long as the objective final structure results.

Although exemplary implementations of the invention have been depicted and described in detail herein, it will be apparent to those skilled in the art that various modifications, additions, substitutions, and the like can be made without departing from the spirit of the invention. For example, an insulative layer could be disposed between the side gate and the layers of the ridge(s) to form an insulated side gate FET. Such an insulative layer would have an appropriate thickness so that the field induced by the gate voltage with respect to the other semiconductive layers will still be sufficient to yield effective ON and OFF states.

The scope of the invention is defined in the following claims.

The invention claimed is:

1. A field effect transistor (FET) device comprising:
a base;
a first layer group having a first nonconductive layer adjacent the base and a first semiconductive layer over the first nonconductive layer;
a second layer group having a second nonconductive layer adjacent the first semiconductive layer and a second semiconductive layer over the second nonconductive layer, the second layer group being vertically stacked on the first layer group;
a top nonconductive layer is disposed above a topmost semiconductive layer;
a source electrode in conductive contact with the first and second semiconductive layers;
a drain electrode spaced apart from the source electrode and in conductive contact with the first and second semiconductive layers;
a first trench disposed between the source and drain electrodes that creates access to first edges of at least all semiconductive layers;
a second trench disposed between the source and drain electrodes generally parallel to and spaced apart from the first trench, the second trench creating access to second edges of at least all semiconductive layers;
a 3-dimensional ridge defined by a portion of the first and second layer groups and the top nonconductive layer between the first and second trenches;
a continuous conductive side gate is disposed on the first edges, a top of the 3-dimensional ridge and the second edges generally perpendicular to the first and second trenches;
a gate electrode disposed in conductive contact with the continuous conductive side gate.

2. The FET device of claim 1 further comprising at least another ridge similar to the 3-dimensional ridge that is disposed between the source and drain electrodes and is substantially parallel to the 3-dimensional ridge, the at least another ridge having third and fourth edges similar to the first and second edges, respectively, the continuous conductive side gate also engaging the third edges, a top of the at least another ridge, and the fourth edges.

3. The FET device of claim 1 further comprising an insulative layer disposed between the continuous conductive side gate and the 3-dimensional ridge.

4. The FET device of claim 1 further comprising the continuous conductive side gate enabling modulation of carrier concentrations in the first and second semiconductive layers.

5. The FET device of claim 4 further comprising a signal path between the source and drain electrodes that passes through the 3-dimensional ridge being switched between ON and OFF states dependent on the modulation of the carrier concentrations.

6. The FET device of claim 5 further comprising the ON and OFF states defined by first and second gate to source voltages, respectively, carrier concentrations being substantially constant across the first and second semiconductive layers within the 3-dimensional ridge in the ON state with the first gate to source voltage, carrier concentrations being substantially depleted across the first and second semiconductive layers within the 3-dimensional ridge in the OFF state with the second gate to source voltage.

7. The FET device of claim 1 further comprising one or more additional vertically stacked layer groups each having an additional nonconductive layer and an additional semiconductive layer, the first and second trenches defining additional first and second edges in each of the additional layer groups, respectively, the continuous conductive side gate extending continuously across the first and additional first edges, the top of the ridge and the second and additional second edges.

8. The FET device of claim 1 further comprising the first and second layer groups not providing a superlattice structure.

9. A field effect transistor (FET) device comprising:
a base;
a first layer group having a first nonconductive layer adjacent the base and a first semiconductive layer over the first nonconductive layer;
a second layer group having a second nonconductive layer adjacent the first semiconductive layer and a second semiconductive layer over the second nonconductive layer;
a source electrode in conductive contact with the first and second semiconductive layers;
a drain electrode spaced apart from the source electrode and in conductive contact with the first and second semiconductive layers;
a ridge of portions of the first and second layer groups is disposed between the source and drain electrodes, the ridge having a top that connects first and second sides that are generally perpendicular to the top, the first and second sides exposing respective first and second edges of each layer in the second layer group and at least the first semiconductive layer in the first layer group;
a conductive side gate that extends continuously across the first edges, the top of the ridge and the second edges;
a gate electrode disposed in conductive contact with the conductive side gate.

10. The FET device of claim 9 further comprising the first and second layer groups having planar layers stacked vertically.

11. The FET device of claim 9 further comprising the conductive side gate providing capacitive and lateral coupling to carriers in the first and second semiconductive layers, the conductive side gate facilitating modulation of carrier concentrations in the first and second semiconductive layers so that a path between the source and drain electrodes of the FET device serves as a switch with ON and OFF states.

12. The FET device of claim 9 further comprising an insulative layer disposed between the conductive side gate and the ridge.

13. The FET device of claim 12 further comprising the ON and OFF states defined by first and second gate to source voltages, respectively, carrier concentrations being substantially constant across the first and second semiconductive layers within the ridge in the ON state with the first gate to source voltage, carrier concentrations being substantially depleted across the first and second semiconductive layers within the ridge in the OFF state with the second gate to source voltage.

14. The FET device of claim 9 further comprising one or more additional vertically stacked layer groups each having an additional nonconductive layer and an additional semiconductive layer, the first and second sides of the ridge defining additional first and second edges in each of the additional layer groups, respectively, the conductive side gate extending continuously across the first and additional first edges, a top of the ridge and the second and additional second edges.

15. The FET device of claim 9 further comprising the first and second layer groups not providing a superlattice structure.

16. A semiconductor implemented radio frequency switch having ON and OFF states comprising:
- a base;
- a first layer group having a first nonconductive layer adjacent the base and a first semiconductive layer over the first nonconductive layer;
- a second layer group having a second nonconductive layer adjacent the first semiconductive layer and a second semiconductive layer over the second nonconductive layer;
- a source electrode in conductive contact with the first and second semiconductive layers;
- a drain electrode spaced apart from the source electrode and in conductive contact with the first and second semiconductive layers;
- a ridge of portions of the first and second layer groups is disposed between the source and drain electrodes, the ridge having a top that connects first and second sides that are generally perpendicular to the top, the first and second sides exposing respective first and second edges of each layer in the second layer group and at least the first semiconductive layer in the first layer group;
- a means for controlling carrier concentration within the first and second semiconductor layers where first carrier concentrations being substantially constant across the first and second semiconductive layers within the ridge correspond to the ON state, second carrier concentrations being substantially depleted across the first and second semiconductive layers within the ridge correspond to the OFF state;
- the carrier concentration controlling means including a conductive side gate that extends continuously across the first edges, the top of the ridge and the second edges;
- a gate electrode disposed in conductive contact with the conductive side gate.

17. The switch of claim 16 further comprising an insulative layer disposed between the conductive side gate and the ridge.

18. The switch of claim 16 further comprising one or more additional vertically stacked layer groups each having an additional nonconductive layer and an additional semiconductive layer, the first and second sides of the ridge defining additional first and second edges in each of the additional layer groups, respectively, the conductive side gate extending continuously across the first and additional first edges, a top of the ridge and the second and additional second edges.

19. The switch of claim 16 further comprising the first and second layer groups not providing a superlattice structure.

20. The switch of claim 16 further comprising at least another ridge similar to the ridge, the another ridge being disposed between the source and drain electrodes and substantially parallel to the ridge, the at least another ridge having third and fourth edges similar to the first and second edges, respectively, the conductive side gate also engaging the third edges, a top of the at least another ridge, and the fourth edges.

* * * * *